United States Patent
Corisis

[19]

[11] Patent Number: 5,982,027
[45] Date of Patent: Nov. 9, 1999

[54] INTEGRATED CIRCUIT INTERPOSER WITH POWER AND GROUND PLANES

[75] Inventor: David J. Corisis, Meridian, Id.

[73] Assignee: Micron Technology, Inc., Boise, Id.

[21] Appl. No.: 08/988,102

[22] Filed: Dec. 10, 1997

[51] Int. Cl.[6] .............................. H01L 23/48; H01L 23/12
[52] U.S. Cl. ..................... 257/666; 257/668; 257/691; 257/664; 257/692
[58] Field of Search .................................. 257/668, 691, 257/666, 664, 692

[56] References Cited

U.S. PATENT DOCUMENTS

| | | | |
|---|---|---|---|
| 4,801,999 | 1/1989 | Hayward et al. | 257/668 |
| 5,068,708 | 11/1991 | Newman | 257/668 |
| 5,089,878 | 2/1992 | Lee | 257/666 |
| 5,214,845 | 6/1993 | King et al. | 257/664 |
| 5,220,195 | 6/1993 | McShane et al. | 257/666 |
| 5,227,232 | 7/1993 | Lim | 257/668 |

*Primary Examiner*—Wael Fahmy
*Assistant Examiner*—Hung Van Duong
*Attorney, Agent, or Firm*—Trask, Britt & Rossa

[57] ABSTRACT

An integrated circuit device has power and ground planes supplied through an interposer secured to the die side. The interposer may consist of a sandwich of metal sheets providing conductive planes for power supply and ground. The planes may be separated by a dielectric which may be designed to provide the necessary decoupling capacitance for the die. The lower of the conductive planes may be of larger surface area and may be adhesively secured to the die, for example, by adhesive tape. The smaller area plane may be secured to the larger area plane through the dielectric layer. With this configuration, each of the conductive planes may be independently wire bonded to the die.

35 Claims, 2 Drawing Sheets

INTEGRATED CIRCUIT INTERPOSER WITH POWER AND GROUND PLANES

This invention relates generally to the provision of power and ground planes for integrated circuit devices and particularly to an interposer with power and ground planes.

BACKGROUND OF THE INVENTION

Conventionally, an integrated circuit device receives power from a power supply and ground via a connection to Vss. Normally, the power and ground connections are connected to the integrated circuit device through power and ground planes.

One issue with power and ground planes in modern integrated circuit devices is that they contribute to inductive ringing. In memory devices, ringing due to package self-inductance can slow down the external interface. It is very desirable to minimize the inductive path for the power supply and ground connections to improve the performance of the integrated circuit.

Inductive ringing has been addressed previously by increasing the number of power and ground lines such that each line handles a reduced capacitive load. However, increasing the number of lines may contribute to increased package size, which may also be undesirable. Conventional power supply and ground planes are positioned on the semiconductor die contributing to larger die size. It is desirable to minimize, to the greatest possible extent, the die size to enable smaller integrated circuit devices to be produced.

Another issue with power supply and ground planes is the necessity to provide capacitive decoupling. Commonly, decoupling capacitors are used to provide the necessary decoupling for the integrated circuit device. Again, these decoupling devices add to cost and size.

As integrated circuits shrink, the importance of reducing package inductance will be even greater. Thus, there is a need for techniques to reduce package inductance.

SUMMARY OF THE INVENTION

In accordance with one aspect of the present invention, an integrated circuit device includes a die, a pair of conductive planes, and an isolation layer. The planes are separated by the isolation layer and are adhesively secured to the die. Each of the planes is electrically connected to the die as well.

In accordance with another aspect of the present invention, an integrated circuit includes a die having a circuit side. A pair of conductive planes are secured to the die side. The planes are insulated from one another. At least one wire extends from each of the planes to the die.

At least some embodiments of the aforementioned aspects advantageously reduce package inductance and have the potential to reduce die size as well.

In accordance with still another aspect of the present invention, an integrated circuit includes a die having a circuit side and a pair of parallel conductive planes. The planes are secured to the die circuit side. A dielectric is positioned between the planes and is adapted to provide decoupling capacitance.

In accordance with yet another aspect of the present invention, an integrated circuit includes a die having a circuit side and a pair of conductive planes. The planes are separated by a dielectric layer such that the planes form a decoupling capacitor together with the dielectric layer for the die. The planes are adhesively secured to the die circuit side. At least one wire from each of the planes is secured to the die as well.

In accordance with but another aspect of the present invention, an integrated circuit device includes a die having a die circuit side. The integrated circuit device includes a pair of rectangular conductive planes and an isolation layer, the planes being separated by the isolation layer and being secured to the die. Each of the planes is substantially the same size as the die side. The integrated circuit device has at least one wire bond connection from each of the planes to the die. The isolation layer is adapted to provide decoupling capacitance for the device.

At least some embodiments of the three aforementioned aspects have the advantages described above and further reduce noise by having the conductive planes also act as a decoupling capacitor.

DESCRIPTION OF THE PREFERRED EMBODIMENTS

Figure 1:
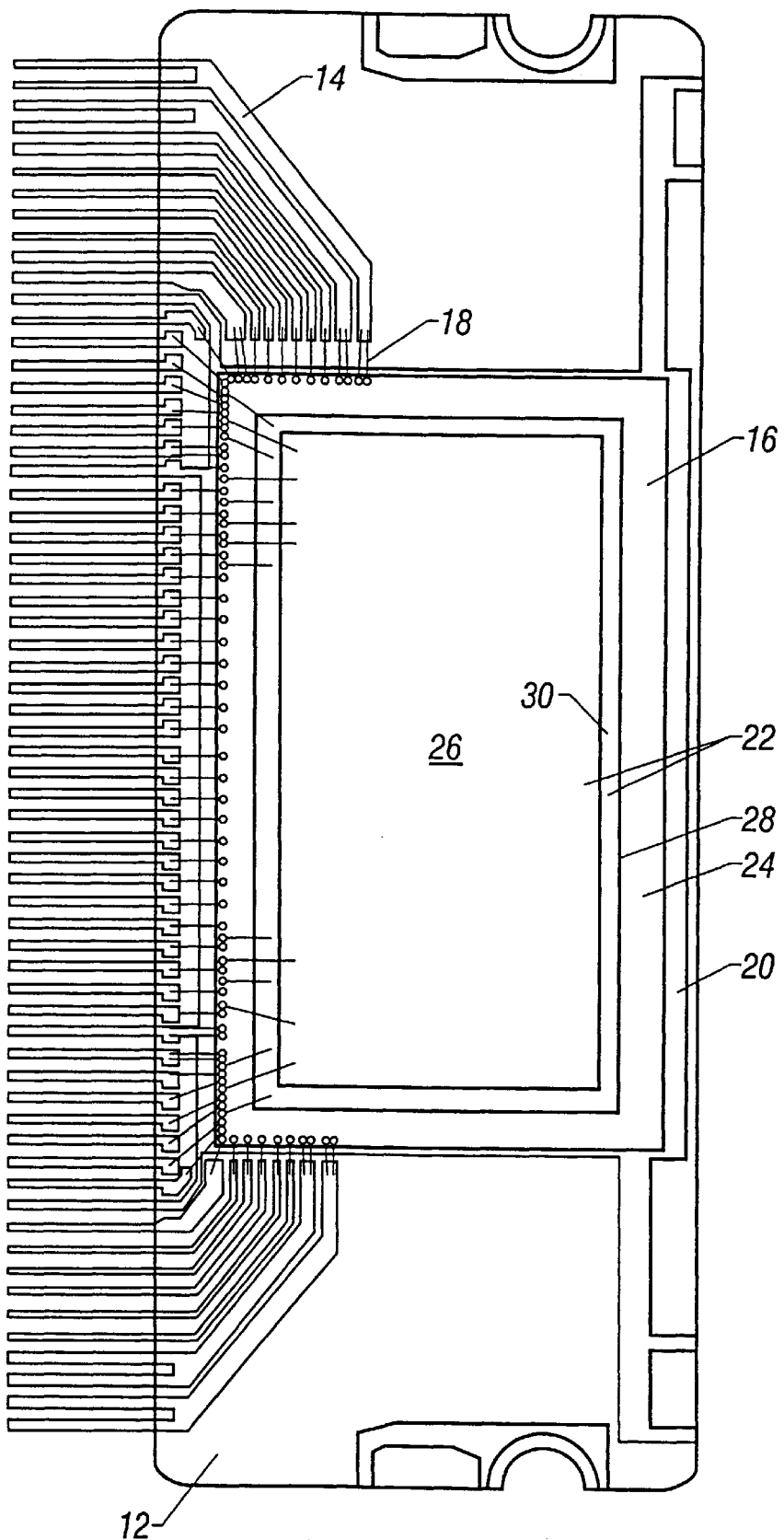
FIG. 1 is a greatly enlarged top plan view of an uncovered integrated circuit package.

Referring to the drawing wherein like reference characters are used for like parts throughout the several views, an integrated circuit device 10, shown in FIG. 1, includes a package 12, lead fingers 14, and an integrated circuit die 16. The lead fingers 14 may be connected to the die 16 using conventional wire bonding techniques, forming wire bonds 18. The die 16 may be secured to a die paddle 20.

While a vertical package is illustrated, other package configurations may also be used such as dual inline packages (DIP), surface mount package (SMP) including area array packages (AAP), such as ball grid arrays (BGA) or leads around periphery packages such as small outline package gull wing leads (SO), and small outline package J leads (SOJ).

A multi-layer rectangular, plate-like interposer 22 is secured to one side of the integrated circuit die 16. The interposer 22 may have an area substantially the same as the die side to which it is attached. More particularly, the interposer 22 is secured on the top surface 24 of the die. The top layer 26 of the interposer may be used for the power supply (or Vcc) and the lower layer 28 may provide the ground (or Vss). The layers 26 and 28 act as the conventional ground and power supply conductive planes.

The layers 26 and 28 may be made of any conductive material including aluminum, copper or the like. By making the planes of a simple rectangular shape inductance may be reduced. Advantageously, one of the layers 26 or 28 has a smaller area than the other so that a region 30 of the lower layer 28 is exposed beyond the edges of the upper layer 26. The layers 26 and 28 may be formed as flex tape with two metal layers coated on an intermediate dielectric in the form of a polymeric tape. In this way, the interposer may be unwound from a reel of a continuous coated film web, cut off to size and applied to the die.

Figure 2:
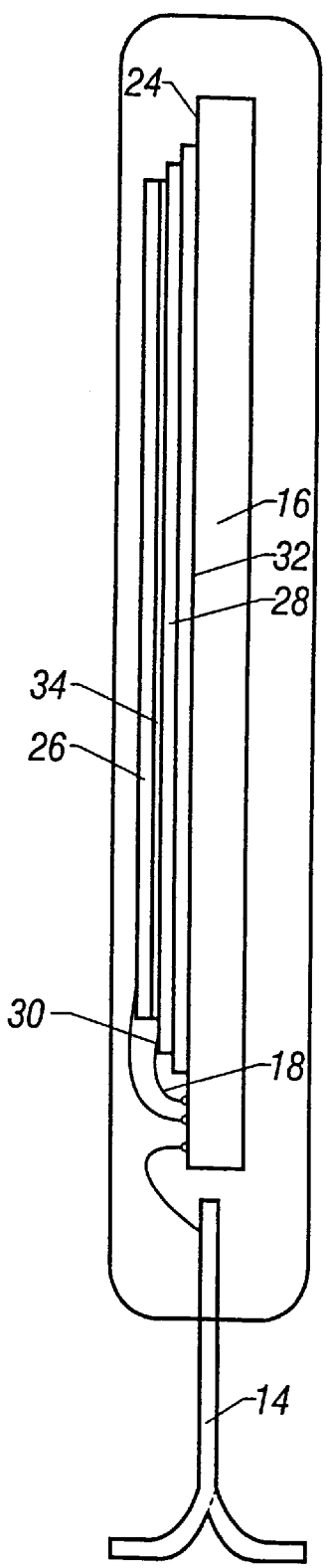
FIG. 2 is an enlarged vertical cross-sectional view through the package shown in FIG. 1.

Referring to FIG. 2, the Vss plane 28 is secured to the die 16 circuit side or top surface 24 adhesively. Adhesive or adhesive tape may be utilized as the adhesive layer 32. For example, two sided lead on chip adhesive tape that is normally used to secure leadframes to integrated circuits may be utilized. This type of adhesive tape is amenable to devices that have large die to package aspect ratios.

The Vss plane 28 and the Vcc plane 26 are sandwiched together around an intermediate dielectric 34. Any variety of well known dielectric layers including plastic layers such as polyimide, tape layers such as capton tape, thin printed circuit board material, FR4 and the like may be utilized for this purpose. Advantageously, the thickness of the dielectric layer 34 is chosen to provide the needed decoupling capacitance for the package 10. That is, the spacing and the nature of the dielectric layer 34 may be chosen to provide the needed decoupling capacitance without providing a separate, additional decoupling capacitor.

In addition, each of the Vss plane 28 and Vcc plane 26 may be separately wire bonded to the die 16. Because of the exposed portion 30 of the Vss plane 28, the Vss plane can be easily wire bonded to the die using wire bonds 18. Similarly, the Vcc plane 26 may be independently wire bonded to the die 16. The die 16 may also be wire bonded to the leads 14.

Through the provision of the planes 26 and 28 on the die side in the fashion of an interposer, a low inductive path for Vcc and Vss may be provided. At the same time, an inherent decoupling capacitor may be formed which advantageously provides the needed decoupling capacitive value. This saves space and cost and may enhance performance by locating the capacitor closer to the die. In addition, the die size may be reduced by removing the Vcc and Vss planes from the die and providing them in the form of an interposer.

While the present invention has been disclosed with respect to a limited number of embodiments, those skilled in the art will appreciate numerous modifications and variations therefrom. For example, while two planes 26 and 28 are shown more planes could be used as well. It is intended that the appended claims cover all such modifications and variations as fall within the true spirit and scope of the present invention.

What is claimed is:

1. An integrated circuit device comprising:

a die having a circuit side; and a decoupling capacitor structure comprising a pair of conductive planes and an isolation layer, said planes being separated by said isolation layer and being adhesively secured to said circuit side of said die, one of said planes being electrically connected to a power terminal of said die and the other of said planes being electrically connected to a ground terminal thereof.

2. The integrated circuit device of claim 1 wherein an adhesive tape is positioned between one of said conductive planes and said circuit side of said die.

3. The integrated circuit device of claim 1 wherein each of said conductive planes is a rectangular metal sheet and one of said conductive planes has a greater area than the other.

4. The integrated circuit device of claim 1 wherein said isolation layer is designed to achieve a needed decoupling capacitance for the device.

5. The device of claim 1 wherein said planes are independently wire bonded to said die.

6. The device of claim 1 wherein one of said planes provides a power supply and the other of said planes provides a ground.

7. The device of claim 1 wherein said planes are stacked one on top of the other.

8. The device of claim 1 wherein each of said planes is substantially the same size as the die.

9. The device of claim 1 wherein said planes are connected by a double sided adhesive tape.

10. The device of claim 1 wherein said planes are formed as layers coated on both sides of a dielectric film.

11. The integrated circuit device of claim 1, wherein said isolation layer and planes each have respective preselected surface areas and further wherein said preselected surface area of said isolation layer is intermediate in size with respect to said surface areas of each of said planes.

12. An integrated circuit device comprising:

a die having a circuit side;

a decoupling capacitor structure comprising a pair of conductive planes secured to said die circuit side, one of said planes being electrically connected to a power terminal of said die, the other of said planes being electrically connected to a ground terminal thereof, and said pair of planes being insulated from one another; and at least one wire bond from each of said planes to said die.

13. The device of claim 12 wherein said conductive planes comprise, one of said sheets being of greater area than the other of said sheets.

14. The device of claim 13 wherein said conductive planes are secured to said die circuit side by adhesive tape.

15. The device of claim 12 wherein said conductive planes are sandwiched together such that a peripheral edge of one of said conductive planes is exposed beyond a peripheral edge of the other of said conductive planes to facilitate independent electrical connection to each of said conductive planes.

16. The integrated circuit device of claim 12, wherein said insulative material and planes each have respective preselected surface areas and further wherein said preselected surface area of said insulative material is intermediate in size with respect to said surface areas of each of said planes.

17. An integrated circuit comprising:

a die having a side bearing a circuit;

a pair of conductive planes secured to said die circuit side, one of said planes being electrically connected to a power terminal of said die and the other of said planes being electrically connected to a ground terminal thereof; and a dielectric between said planes adapted to provide a decoupling capacitance for said circuit.

18. The integrated circuit of claim 17 wherein said conductive planes are secured together through said dielectric.

19. The integrated circuit of claim 18 wherein said planes are of different areas so that a portion of a lower of said planes extends outwardly beyond an upper of said planes.

20. The integrated circuit of claim 19 wherein the plane having a larger area is secured to said die side and the plane having a smaller area is secured above said larger area plane.

21. The integrated circuit of claim 17 including a wire bond connection from each of said planes to said die to provide a pair of capacitive leads on said die.

22. The integrated circuit device of claim 17, wherein said conductive planes each have a preselected surface area and said dielectric between said conductive planes occupies a surface area exceeding said surface area of one said conductive plane but not exceeding said surface area of other said plane.

23. An integrated circuit device comprising:

a die having a circuit side;

a pair of parallel conductive planes and a dielectric layer, one of said planes being electrically connected to a power terminal of said die and the other of said planes being electrically connected to a ground terminal thereof and said planes being separated by said dielectric layer to form a decoupling capacitor for said die, said planes being adhesively secured to said die circuit side; and at least one wire bond from each of said planes to said die.

24. The integrated circuit device of claim 23 wherein one of said conductive planes has a larger area than the other, said larger area conductive plane being adhesively secured to said die.

25. The integrated circuit device of claim 24 wherein the other plane is secured to said larger area plane by said dielectric layer.

26. The integrated circuit device of claim 25 wherein said larger area plane is secured to said die by adhesive tape.

27. The integrated circuit device of claim 26 wherein said larger area plane provides a ground connection and said smaller area plane provides a power supply connection.

28. The device of claim 23 wherein each of said planes is substantially the same size as the die.

29. The device of claim 23 wherein said planes are connected by a double sided adhesive tape.

30. The integrated circuit device of claim 23, wherein said dielectric layer and planes each have respective preselected surface areas and further wherein said preselected surface area of said dielectric layer is intermediate in size with respect to said surface areas of each of said planes.

31. An integrated circuit device comprising:

a die having a die circuit side;

a pair of rectangular conductive planes and an isolation layer, one of said planes being electrically connected to a power terminal of said die and the other of said planes being electrically connected to a ground terminal thereof and said planes being separated by said isolation layer and being secured to said die circuit side;

each of said planes being substantially the same size as said die circuit side;

at least one wire bond connection from each of said planes to said die; and said isolation layer being adapted to provide decoupling capacitance for said device.

32. The device of claim 31 wherein said isolation layer comprises a film and said planes comprise coatings on said film.

33. The device of claim 31 wherein said isolation layer is a double sided adhesive tape.

34. The device of claim 31 wherein an upper of said planes has a smaller surface area than the other of said planes.

35. The integrated circuit device of claim 31, wherein said isolation layer and planes each have respective preselected surface areas and further wherein said preselected surface area of said isolation layer is intermediate in size with respect to said surface areas of each of said planes.

* * * * *

UNITED STATES PATENT AND TRADEMARK OFFICE
CERTIFICATE OF CORRECTION

PATENT NO.    : 5,982,027
DATED         : November 9, 1999
INVENTOR(S)   : David J. Corisis It is certified that error appears in the above-identified patent and that said Letters Patent is hereby corrected as shown below:

Column 1,
Line 28, after "semiconductor die" insert -- , --
Line 50, change "are" to -- is --
Line 51, after "die" insert -- circuit --

Column 2,
Line 9, after "die" insert -- circuit --
Line 37, change "package" to -- packages --
Line 42, after "multi-layer" insert -- , --
Line 47, after "interposer" insert -- 22 --
Line 51, after "28" insert -- (also referred to as planes 26 and 28) --
Line 53, after "shape" insert -- , --

Column 3,
Line 2, after "dielectric" insert -- layer --
Line 8, change "10" to -- 12 --
Line 18, change "leads" to -- lead fingers --
Line 19, after "die" insert -- circuit --
Line 32, after "shown" insert -- , --
Line 40, after "said" insert -- conductive --
Lines 43 and 44, before "planes" insert -- conductive --
Lines 56, 58, 59, 61, 63 and 65, after "said" insert -- conductive --

Column 4,
Lines 1, 12, 37, 46, 47, 48, 60 and 64, after "said" insert -- conductive --
Line 4, before "planes" insert -- said conductive --
Line 7, after "of said" insert -- conductive --
Lines 17, 38, 53 and 65, before "planes" insert -- conductive --
Line 19, after "comprise" and before "," insert -- sheets -- and after "being of" insert -- a --
Line 41, after "said" insert -- conductive -- and delete "a" (second occurrence) at end of line
Line 42, after "said" insert -- integrated --
Line 49, after "wherein" change "the" to -- a --
Line 50, after "die" insert -- circuit -- and change "the" to -- a --
Line 59, change "plane" to -- planes --

UNITED STATES PATENT AND TRADEMARK OFFICE
CERTIFICATE OF CORRECTION

PATENT NO. : 5,982,027
DATED : November 9, 1999
INVENTOR(S) : David J. Corisis

It is certified that error appears in the above-identified patent and that said Letters Patent is hereby corrected as shown below:

Column 5,
Lines 1, 3, 5, 18, 20, 23 and 26, before "planes" insert -- conductive --
Line 11, change "other" to -- another -- and before "plane" insert -- conductive --
Line 16, change "said" to -- a --

Column 6,
Lines 2, 3, 5, 7, 9, 14, 22 and 25, before "planes" insert -- conductive --
Line 18, after "said" insert -- conductive --
Line 19, change "the other" to -- a lower -- and after "said" insert -- conductive --

Signed and Sealed this

Eighteenth Day of November, 2003

JAMES E. ROGAN
*Director of the United States Patent and Trademark Office*